United States Patent
Word

(10) Patent No.: US 7,493,587 B2
(45) Date of Patent: Feb. 17, 2009

(54) CHROMELESS PHASE SHIFTING MASK FOR INTEGRATED CIRCUITS USING INTERIOR REGION

(76) Inventor: James Word, 10943 SW. Adele Dr., Portland, OR (US) 97225

( * ) Notice: Subject to any disclaimer, the term of this patent is extended or adjusted under 35 U.S.C. 154(b) by 333 days.

(21) Appl. No.: 11/144,157

(22) Filed: Jun. 2, 2005

(65) Prior Publication Data

US 2006/0199084 A1    Sep. 7, 2006

Related U.S. Application Data

(60) Provisional application No. 60/658,278, filed on Mar. 2, 2005.

(51) Int. Cl.
*G06F 17/50* (2006.01)
(52) U.S. Cl. .............................. 716/19; 716/1; 716/11; 716/21
(58) Field of Classification Search .................. 716/1, 716/11, 19, 21
See application file for complete search history.

(56) References Cited

U.S. PATENT DOCUMENTS

| | | | |
|---|---|---|---|
| 4,532,650 A | 7/1985 | Wihl et al. | |
| 4,762,396 A | 8/1988 | Dumant et al. | |
| 4,989,156 A | 1/1991 | Ikenaga | |
| 5,502,654 A | 3/1996 | Sawahata | |
| 5,655,110 A | 8/1997 | Krivokapic et al. | |
| 5,699,447 A | 12/1997 | Alumot et al. | |
| 5,723,233 A | 3/1998 | Garza et al. | |
| 5,825,647 A | 10/1998 | Tsudaka | |
| 5,879,844 A | 3/1999 | Yamamoto et al. | |
| 5,991,006 A | 11/1999 | Tsudaka | |
| 6,016,357 A | 1/2000 | Neary et al. | |
| 6,049,660 A | 4/2000 | Ahn et al. | |
| 6,056,785 A | 5/2000 | Chisaka | |
| 6,077,310 A | 6/2000 | Yamamoto et al. | |
| 6,120,952 A | 9/2000 | Pierrat et al. | |
| 6,128,067 A | 10/2000 | Hashimoto | |
| 6,187,483 B1 | 2/2001 | Capodieci et al. | |

(Continued)

FOREIGN PATENT DOCUMENTS

JP          09319067 A     12/1997
WO     WO 01/65315 A2     9/2001

OTHER PUBLICATIONS

Cobb, N. "Flexible sparse and dense OPC algorithms," *Proceedings of SPIE*, vol. 5853, *Photomask and Next-Generation Lithography Mask Technology XII*, Bellingham, Washington, 2005, pp. 693-702.

(Continued)

*Primary Examiner*—Thuan Do
(74) *Attorney, Agent, or Firm*—Klarquist Sparkman, LLP

(57) ABSTRACT

A system for creating mask layout pattern data in order to create a number of desired features on a semiconductor wafer. Critical features and features that are adjacent to or abut critical features are formed as phase shifting regions on a mask. Larger, non-critical features can be formed as annular rim shifters and may include one or more filling phase shifting regions. Non-critical features that are not adjacent to critical features and/or sub-resolution features that are not desired to print on the wafer can be formed as opaque or partially transparent regions on the mask.

25 Claims, 8 Drawing Sheets

U.S. PATENT DOCUMENTS

| | | | |
|---|---|---|---|
| 6,243,855 | B1 | 6/2001 | Kobayashi et al. |
| 6,249,904 | B1 | 6/2001 | Cobb |
| 6,263,299 | B1 | 7/2001 | Aleshin et al. |
| 6,269,472 | B1 | 7/2001 | Garza et al. |
| 6,301,697 | B1 | 10/2001 | Cobb |
| 6,312,854 | B1 | 11/2001 | Chen et al. |
| 6,317,859 | B1 | 11/2001 | Papadopoulou |
| 6,370,679 | B1 | 4/2002 | Chang et al. |
| 6,416,907 | B1 | 7/2002 | Winder et al. |
| 6,425,117 | B1 | 7/2002 | Pasch et al. |
| 6,453,452 | B1 | 9/2002 | Chang et al. |
| 6,453,457 | B1 | 9/2002 | Pierrat et al. |
| 6,467,076 | B1 | 10/2002 | Cobb |
| 6,499,003 | B2 | 12/2002 | Jones et al. |
| 6,620,561 | B2 | 9/2003 | Winder et al. |
| 6,643,616 | B1 | 11/2003 | Granik et al. |
| 6,665,845 | B1 | 12/2003 | Aingaran et al. |
| 6,728,946 | B1 | 4/2004 | Schellenberg et al. |
| 6,792,159 | B1 | 9/2004 | Aufrichtig et al. |
| 6,792,590 | B1 | 9/2004 | Pierrat et al. |
| 6,815,129 | B1 | 11/2004 | Bjorkholm et al. |
| 6,851,103 | B2 | 2/2005 | Van Den Broeke et al. |
| 6,887,633 | B2 | 5/2005 | Tang |
| 6,901,576 | B2 * | 5/2005 | Liebmann et al. |
| 7,155,689 | B2 * | 12/2006 | Pierrat et al. .................. 716/4 |
| 7,172,838 | B2 | 2/2007 | Maurer et al. |
| 7,266,803 | B2 | 9/2007 | Chou et al. |
| 2002/0199157 | A1 | 12/2002 | Cobb |
| 2003/0170551 | A1 | 9/2003 | Futatsuya |
| 2004/0005089 | A1 | 1/2004 | Robles et al. |
| 2004/0088149 | A1 | 5/2004 | Cobb |
| 2005/0050490 | A1 | 3/2005 | Futatsuya et al. |
| 2005/0149901 | A1 | 7/2005 | Tang |
| 2006/0200790 | A1 | 9/2006 | Shang et al. |
| 2006/0240342 | A1 | 10/2006 | Tang |
| 2006/0269875 | A1 | 11/2006 | Granik |
| 2007/0006113 | A1 | 1/2007 | Hu et al. |
| 2007/0198963 | A1 | 8/2007 | Granik et al. |

OTHER PUBLICATIONS

Cobb, N., and Y. Granik, "Model-Based OPC Using the MEEF Matrix," *Proceedings of SPIE*, vol. 4889: *22nd Annual BACUS Symposium on Photomask Technology*, Monterey, Calif., Sep. 30-Oct. 4, 2002, p. 147.

Cobb, N., and A. Zakhor, "Experimental Results on Optical Proximity Correction With Variable Threshold Resist Model," *Proceedings of SPIE*, vol. 3051: *Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE*, vol. 2440: *Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE*, vol. 2621: *15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE*, vol. 2197: *Symposium on Optical/Laser Microlithography VII*, San Jose, Calif., Mar. 2-4, 1994, pp. 348-360.

Cobb., N., et al., "Mathematical and CAD Framework for Proximity Correction," *Proceedings of SPIE*, vol. 2726: *Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE*, vol. 5130: *Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE*, vol. 4754: *Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE*, vol. 3334: *Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE*, vol. 2884: *16th Annual Symposium on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics* 37(12B):6686-6688, Dec. 1998.

Chen, J., et al., "RET Masks for the Final Frontier of Optical Lithography," *Proceedings of SPIE*, vol. 5853: *Photomask and Next-Generation Lithography Mask Technology XII*, Yokohama, Japan, Apr. 13, 2005, pp. 168-179.

Granik, Y., "Illuminator Optimization Methods in Microlithography," *Proceedings of SPIE*, vol. 5524: *Novel Optical Systems Design and Optimization VII*, Denver, Colorado, Aug. 2, 2004, pp. 217-229.

Granik, Y., "Solving Inverse Problems of Optical Microlithograpy," *Proceedings of SPIE*, vol. 5754: *Optical Microlithography XVIII*, San Jose, Calif., Mar. 1, 2005, pp. 506-526.

Granik, Y., "Source Optimization for Image Fidelity and Throughput," *Journal of Microlithography, Microfabrication, and Microsystems*, vol. 3, Oct. 2004, pp. 509-522.

Sturtevant, J., et al. "Assessing the Impact of Real World Manufacturing Lithography Variations on Post-OPC CD Control," *Proceedings of SPIE*, vol. 5756: *Design and Process Integration for Microelectronic Manufacturing III*, San Jose, Calif., Mar. 4, 2005, pp. 240-254.

Sturtevant, J., et al. "Considerations for the Use of Defocus Models for OPC," *Proceedings of SPIE*, vol. 5756: *Design and Process Integration for Microelectronic Manufacturing III*, San Jose, Calif., Mar. 4, 2005, pp. 427-436.

Van Den Broeke, D., et al., "Contact and Via Hole Mask Design Optimization for 65nm Technology Node," *Proceedings of SPIE*, vol. 5567: *24th Annual BACUS Symposium on Photomask Technology*, Monterey, Calif., Sep. 14, 2004, pp. 680-690.

Word, J., et al. "Advanced Layout Fragmentation and Simulation Schemes for Model Based OPC," *Proceedings of SPIE*, vol. 5754: *Optical Microlithography XVIII*, San Jose, Calif., Mar. 1, 2005, pp. 1159-1168.

* cited by examiner

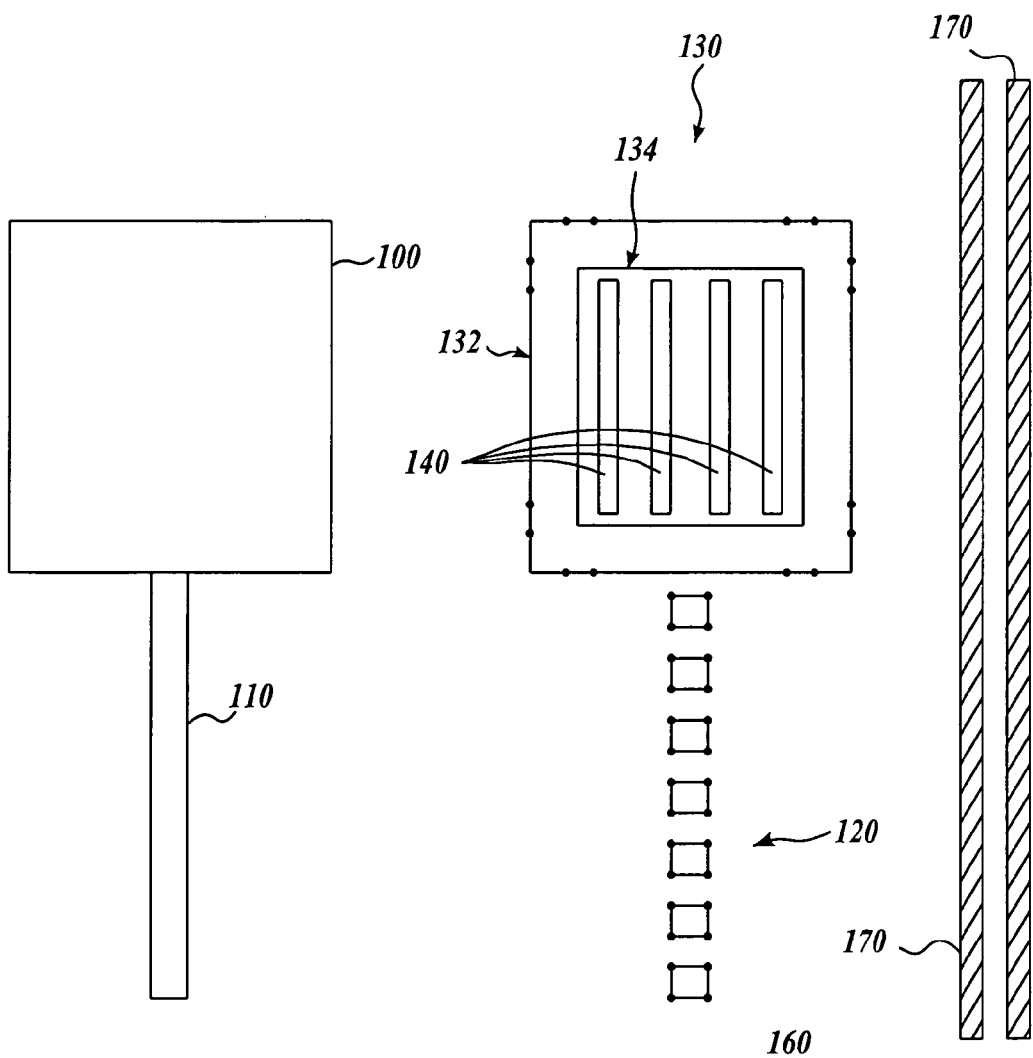
*Fig.2A.*
*Fig.2B.*
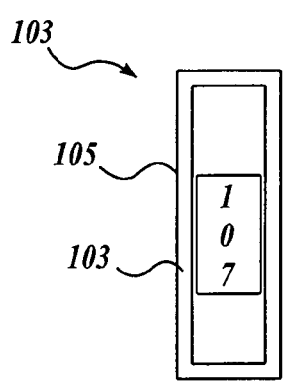
*Fig.2C.*
CONVENTIONAL RIM SHIFTER
AROUND CHROME

CHROMELESS PHASE SHIFTING MASK FOR INTEGRATED CIRCUITS USING INTERIOR REGION

CROSS-REFERENCE TO RELATED APPLICATION

This application claims the benefit of U.S. Provisional Application Ser. No. 60/658,278, filed Mar. 2, 2005, which is herein incorporated by reference.

FIELD OF THE INVENTION

The present invention relates to photolithographic processing techniques and in particular, to chromeless mask layouts.

BACKGROUND OF THE INVENTION

In conventional photolithographic processing of integrated circuits, a wafer having photosensitive chemicals deposited thereon is exposed through a mask or reticle. The mask or reticle has a pattern of clear and opaque chrome features that will selectively expose areas of the wafer much like a photolithographic negative. The exposed wafer is then further processed in order to create the circuit components of an integrated circuit.

While conventional chrome-on-glass photolithographic masks work well for many technologies, it is difficult to print the smallest features of the latest circuit designs with chrome patterns. One technique used to print the smallest features of a layout is by using phase shifters. A phase shifter operates to shift the phase of the illumination light by some amount, typically 180 degrees, with respect to light that passes through an adjacent, non-phase shifting area of the mask. The phase shifted and non-phase shifted light destructively interfere on the surface of the wafer to create desired patterns on the wafer.

As illustrated in FIG. 1A, it is well known to those skilled in the art that the image of a single chromeless 0°-180° phase transition 2 on a mask forms an image with a single interference fringe that forms a single very thin dark line. It is also known that two 0°-180° phase transitions 4 far apart print as two distinct thin lines, but that under certain conditions, depending on the illumination wavelength and angle as well as the imaging system numerical aperture, these two features will merge into a single dark line when the two transitions are close enough together such as 6. Larger numbers of phase transitions 8 will merge into a single large dark area, as long as the spacing between any two transitions is less than the separation at which these phase transitions merge for that particular optical system. Masks using these techniques, in which regions traditionally formed with opaque mask structures have been replaced with transparent twin phase edges or larger phase gratings are generally called "chromeless phase masks".

While phase shifting technology is relatively well known in the art, it is often difficult to create the masks that use phase shifters for the smallest components as well as other exposure techniques for larger features. Therefore, there is a need for a mechanism for converting a layout into mask features that can print both small and larger features and can be easily manufactured.

SUMMARY OF THE INVENTION

The present invention is a system and method for creating mask pattern data to create one or more features on a wafer. The mask data defines phase shifters for critical features. The mask data for larger features that are adjacent to critical features define annular rim phase shifters and may include one or more filling phase shifting regions. Data for non-critical features that are not adjacent to critical features and/or sub-resolution assist features may define chrome or partially transparent features on a mask.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 2A and 2B illustrate one embodiment of a method of decomposing a desired layout pattern into mask data defining a pattern of phase shifters in accordance with the present invention;

FIG. 2C illustrates a conventional rim shifting region around an opaque feature;

DETAILED DESCRIPTION OF THE PREFERRED EMBODIMENT

As indicated above, the present invention is a method for decomposing a layout of features to be created in an integrated circuit design into mask pattern data used to create corresponding photolithographic masks that will in turn create the circuit features on a wafer.

Figure 1A:
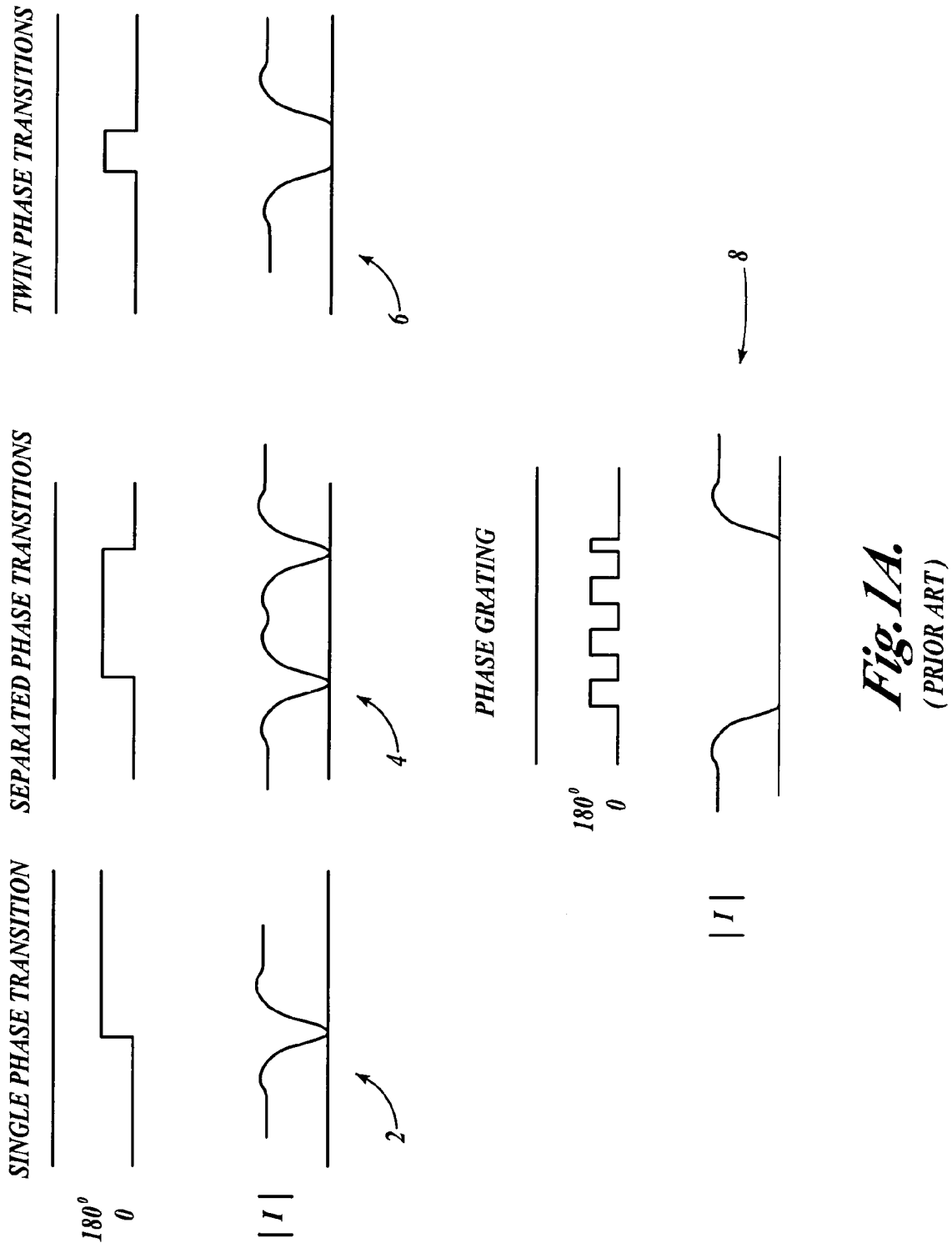
FIG. 1A illustrates phase transition patterns and corresponding image intensities on a wafer.
Figure 1B:
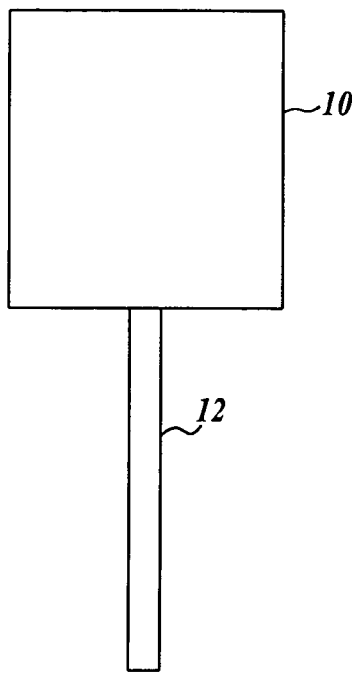
FIGS. 1B-1D illustrate a simplified layout pattern and two prior art layout data decomposition techniques.

FIG. 1B illustrates a simplified pattern of features in a layout that are to be created on a semiconductor wafer. The pattern includes a large square area 10 which may represent a contact pad that is joined to a thinner feature 12, which may represent a transistor gate. The contact pad 10 may be large enough that it can be created using a conventional chrome-on-glass pattern on a photolithographic mask. However, the thinner feature 12 is too small to be created with a conventional chrome pattern and therefore must be made by some other technique such as by using a phase shifter. In order to avoid having to create the pattern of features on a wafer with a double exposure process and two masks, so called "hybrid phase shift masks" such as that shown in FIG. 1C have been proposed. In a hybrid phase shift mask, a large opaque chrome pattern 16 corresponds to the contact pad 10, while a series of phase gratings 18 create the thinner feature 12. The phase grating 18 includes a number of phase shifting regions 20a, 20b, 20c, etc., that are etched or deposited with a phase shifting material that operates to shift the phase of the light compared with the phase of the light that passes through areas surrounding the phase shifting regions. Such light destructively interferes on the surface semiconductor wafer and will create an unexposed line that is further processed to make the circuit feature.

Figure 1C:
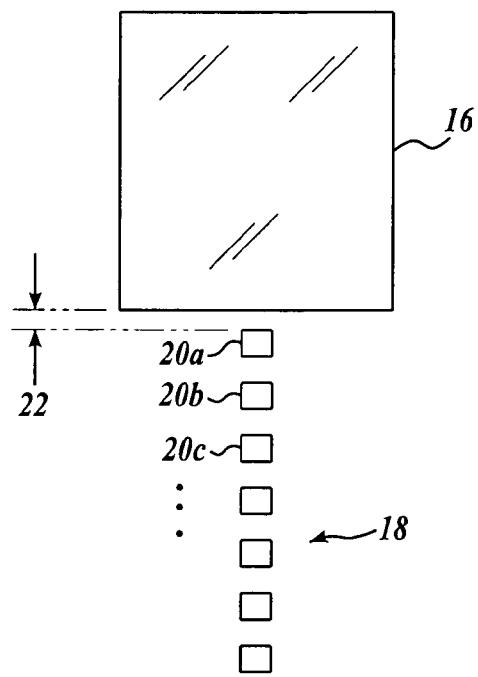

To create a hybrid phase shift mask such as that shown in FIG. 1C, different processes are used to create the large chrome area 16 and the phase gratings 18. If the mask is not correctly aligned during the two procedures, it is possible that a gap 22 or other problems may form due to misalignment. The gap 22 may prevent the thinner feature 12 from making electrical contact with the contact pad 10 in integrated circuits that are made with the mask, thereby leading to circuit malfunction.

Figure 1D:
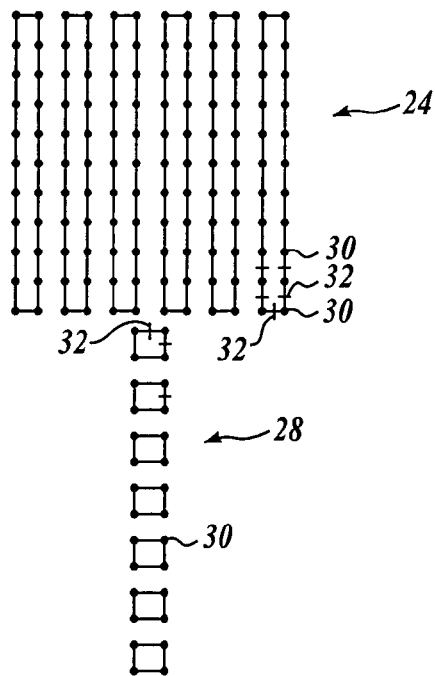

In order to avoid having to use two different processes to create a semiconductor mask, a mask such as that shown in FIG. 1D can be used to print the desired layout pattern. FIG. 1D illustrates a chromeless phase shifting mask that creates both non-critical and critical features on a wafer with a corresponding phase shifting region on the mask. In FIG. 1D, the larger contact pad 10 is formed with a number of alternating phase shifting regions 24 and the circuit feature 12 is formed with a phase grating 28.

In order to ensure that the pattern on the mask will print as desired, it is often necessary to perform some sort of resolution enhancement technique (RET) such as optical and process correction (OPC). OPC generally works by modeling where an edge of a desired feature will print and moving a corresponding edge or portion thereof on the mask in order to compensate for the expected optical distortions that will occur during the printing process. During OPC, each feature defined in the layout is fragmented into a number of edge segments. Each edge fragment is defined by a pair of fragmentation endpoints 30. A simulation site 32 is usually defined between the endpoints 30 of the edge fragments. The simulation sites are the locations where the aerial image intensity for the edge segment is calculated. As can be seen in FIG. 1D, printing larger features with a number of alternating phase shifting patterns 24 significantly increases the number of fragmentation endpoints required to perform OPC. Therefore, the amount of computer time required to ensure that the mask layout pattern will print properly is correspondingly increased.

Figure 1E:
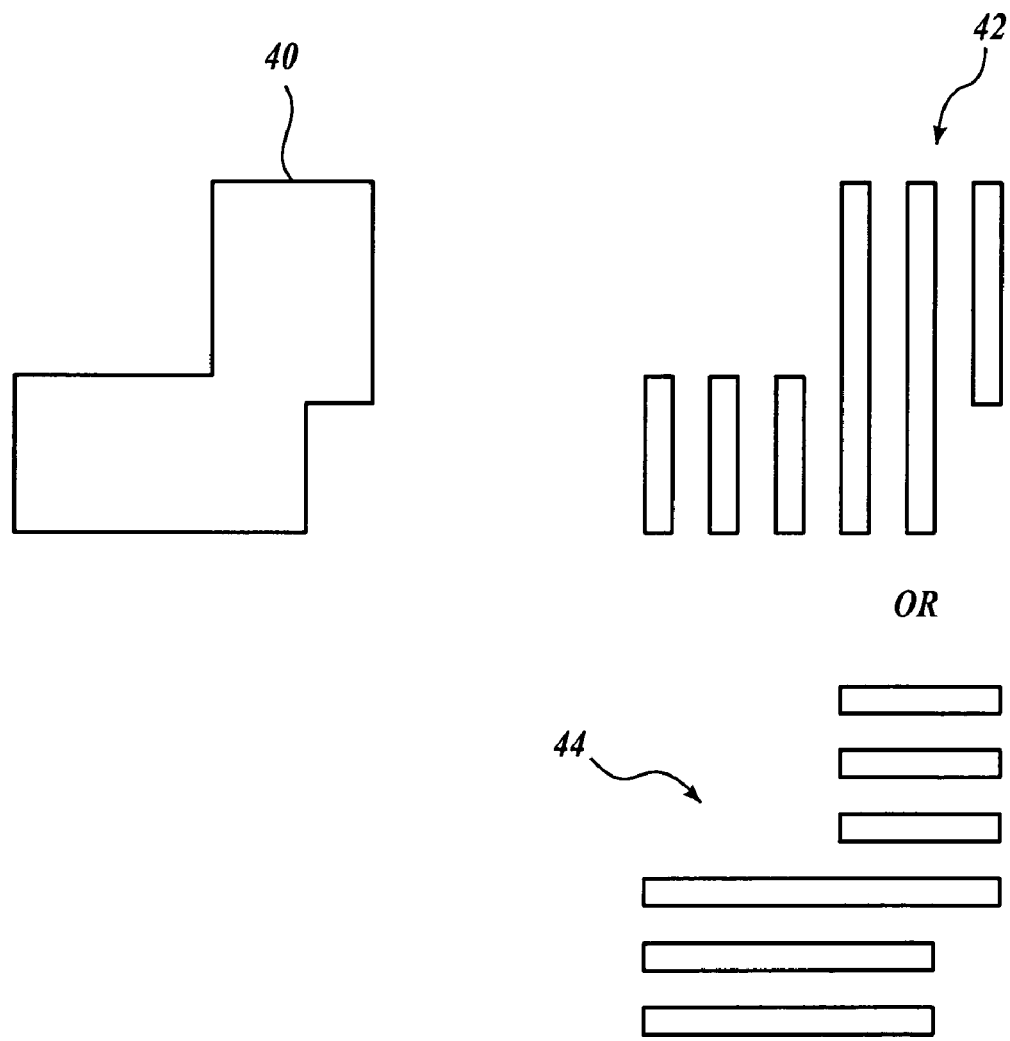
FIG. 1E illustrates alternative methods that can be used to convert a desired layout pattern into a pattern of alternating phase shifters.

FIG. 1E illustrates another problem with creating chromeless phase shifting masks of the type shown in FIG. 1D. In the example shown, a layout pattern 40 to be created on a wafer can be formed with a phase shifting area having a set of vertical, alternating phase shifting regions 42 or with a set of horizontal, alternating phase shifting regions 44. It is often not clear which pattern is preferable and a rule based system for decomposing objects into a number of alternating phase shifting regions may be difficult to implement. In addition, the selection of one pattern or the other may adversely affect the features that surround the target feature.

FIGS. 2A and 2B illustrate one technique for decomposing layout features to be printed on a semiconductor wafer in accordance with an embodiment of the present invention. As with the example described above, the feature to be created includes a relatively large feature 100 such as a contact pad and an adjoining critical feature 110. The feature 100 is generally non-critical, but the feature 110 is small enough that it cannot be manufactured with a conventional chrome-on-glass mask pattern.

In this application, "critical" features are generally those of smaller physical dimensions, while non-critical features are of larger physical dimensions. In some embodiments, "critical" features are only those that have the minimum allowable physical dimension, while in other embodiments, other criteria for "critical" may be employed. Designation of a feature as "critical" may also be related to the electrical functionality of the feature—for example, transistor gates may be at minimum dimension, but also have a critical electrical role in the circuit, whereas other polysilicon features of the same minimum dimension may be merely conducting paths and be designated "non-critical". Designation of "critical" may also be derived from the position within the schematic netlist within which a device or circuit element is found, with some "nets" being designated as more critical than others. The requirements on the resolution and overlay may be tighter for those features designated as being "critical", requiring special handling in manufacturing.

Figure 2D:
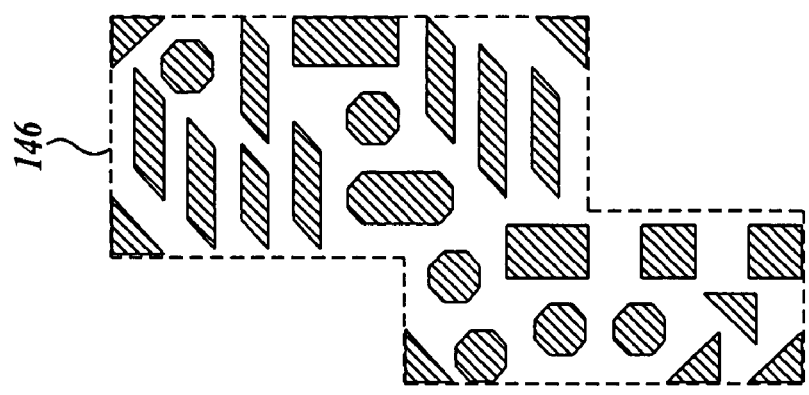
FIG. 2D illustrates various types of filling phase shifting patterns that can be used in accordance with the present invention.
Figure 2D:
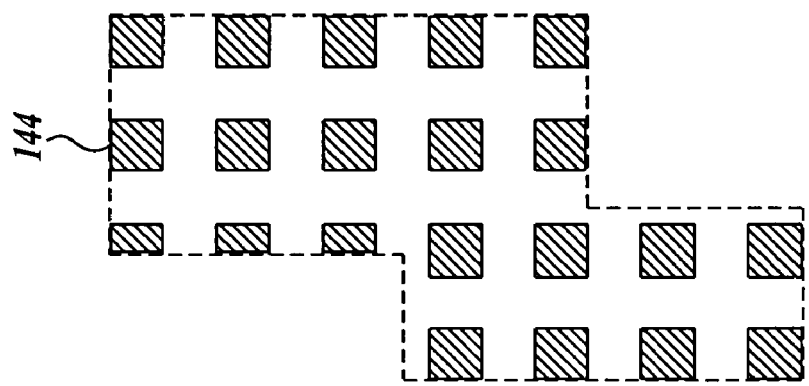
Figure 2D:
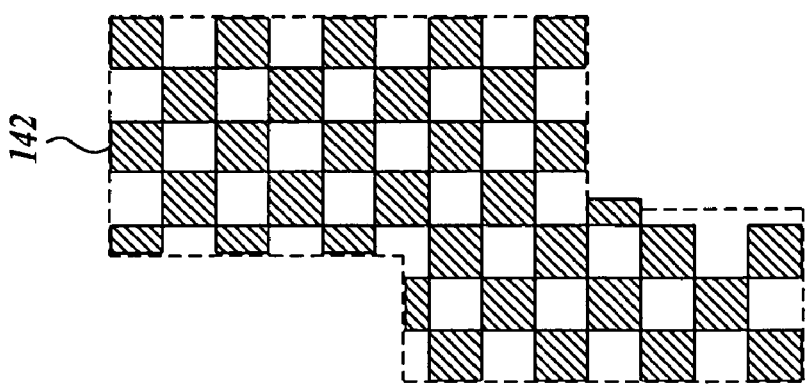

To produce the layout pattern shown in FIG. 2A, one embodiment of the present invention decomposes the feature 110 into data for a corresponding phase grating pattern 120 that comprises a number of aligned phase shifting regions. In addition, the larger feature 100 is decomposed into data for an annular rim shifter 130. In the contrast to a conventional rim shifter 103 having a phase shifting region 105 that surrounds an opaque chrome area 107 (see FIG. 2C), the present invention creates a rim shifter 130 that comprises a continuous or non-continuous annular phase-shifting region having an outer edge 132 and an inner edge 134. If space permits and if needed, the annular rim shifter 130 may include a number of filling phase shifting regions 140. These filling phase shifting regions 140 are sized and positioned such that the combination of the annular rim shifter 130 and the filling phase shifting regions 140 print as if the region occupied by the rim phase shifter 130 and the phase shifting regions 140 were opaque. It should be noted that the space can be filled with any number of chromeless phase shifting patterns, as long as the distance between the two edges is less than the minimum separation for the given lithography system. Shown in FIG. 2D are several other varieties of filling phase shifting regions 142, 144, 146, comprising diagonal lines, regular dots, checkerboards, or a random jumble of phase shifters. All will form an image that is dark on the wafer as long as the phase edges are close enough together. Therefore, filling phase shifting regions described in this application, include traditional gratings of regular, evenly spaced periodic structures, as well as non-evenly spaced structures, and non-periodic structures.

In addition, the mask may also include opaque regions 160 that print non-critical features and/or sub-resolution assist features (SRAFs) 170. The opaque regions 160 on the mask can be made of chrome, provided that they are non-critical features or are not adjacent to critical features or adjacent to features that are formed with phase shifters whereby a misalignment of the mask during a multi-step mask creation process could create errors. It should be noted that these "opaque" regions can also be converted to partially transparent regions, and in particular partially transparent phase shifting regions (sometimes called "attenuated phase shifting masks", with a typical transmission of 6% or 9%) when conditions favor the use of this technique for lithographic performance. In addition, the one or more opaque sub-resolution assist features 170 are preferably made of chrome that is dimensioned so that they themselves will not print on the wafer.

Figure 3:
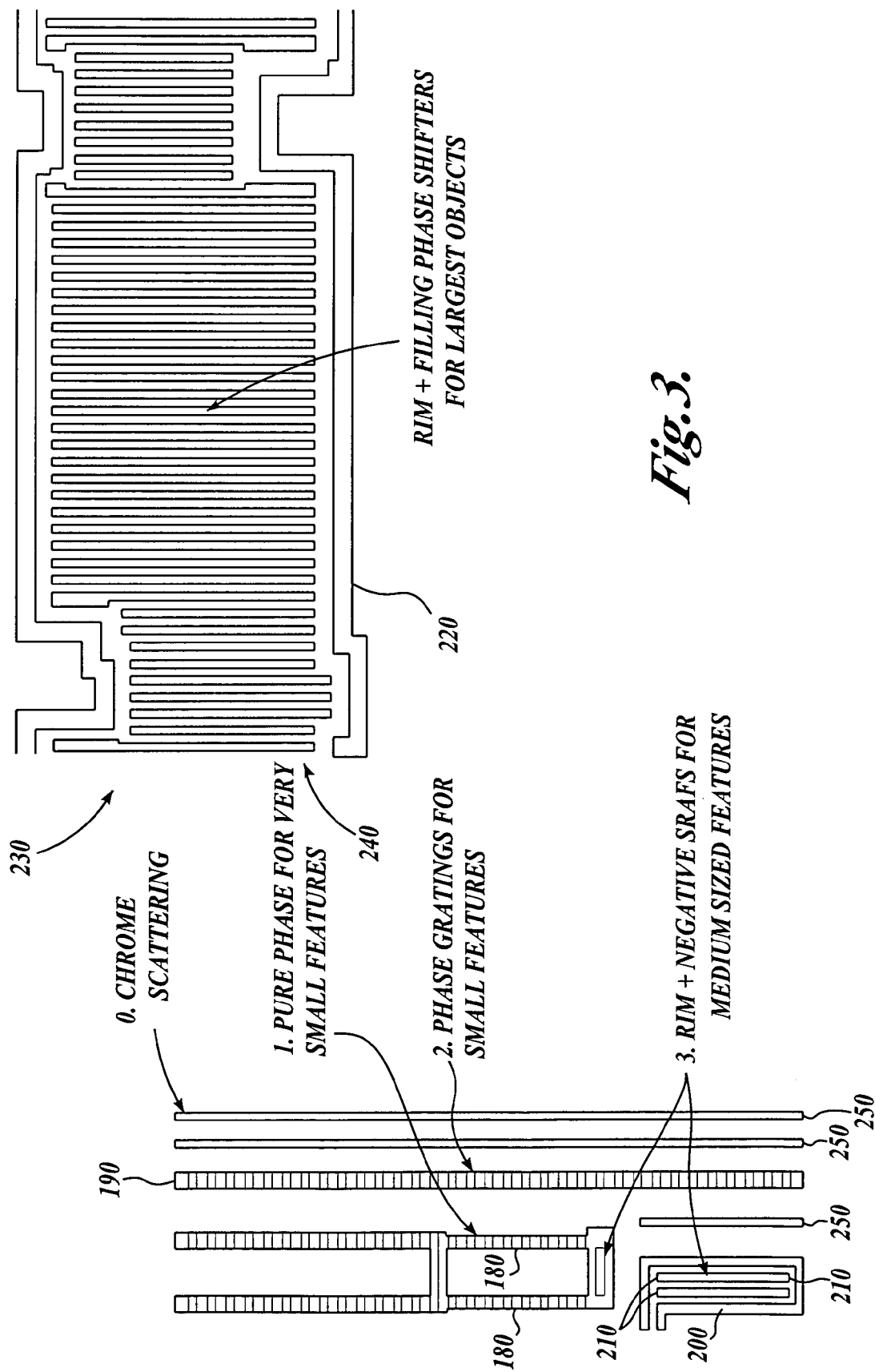
FIG. 3 illustrates mask features that create various sized circuit features on a wafer with phase shifters in accordance with the present invention.

FIG. 3 illustrates another example of a mask that forms features of various sizes with phase shifting regions in accordance with the present invention. As indicated above, the mask includes a number of phase shifting regions 180 formed of uniform phase-shifting areas that create the smallest features on a semiconductor wafer. Such phase shifting regions 180 may be used to create features having a mask error enhancement factor (MEEF) that is greater than zero.

Slightly larger features in the layout can be made with simple phase gratings 190. The simple phase gratings 190 include alternating patterns of phase shifting regions and non-phase shifting regions.

Features that are slightly larger yet in the layout may be made with annular rim phase shifters 200 that may or may not include one or more filling phase shifting regions 210 in the interior of the rim. Finally, the largest features in the layout may be created with an annular rim phase shifter 220 and a number of filling phase shifting regions 230 in the interior of the rim. The annular rim of the phase shifter 220 need not be continuous around the perimeter of the phase shifting region. Rather, as illustrated in FIG. 3, the rim of the phase shifter 220 may include non-continuous gaps 240 around the perimeter of the rim. The gaps 240 may be filled with the filling phase shifting regions 230 generated using the same algorithm as used for the phase structures in the interior of the region 230 or with other phase shifting structures. Furthermore, the filling phase shifting regions 230 need not be vertical stripes as shown. For example, the filling phase shifting regions 230 may comprise horizontal stripes, diagonal stripes, a checkerboard or tiling pattern of phase shifters, or a random pattern as illustrated in FIG. 2D. In addition, if there are larger features in the layout that are not critical and are not adjacent to critical features in the circuit, the larger features could be formed with chrome areas on the mask.

Figure 4:
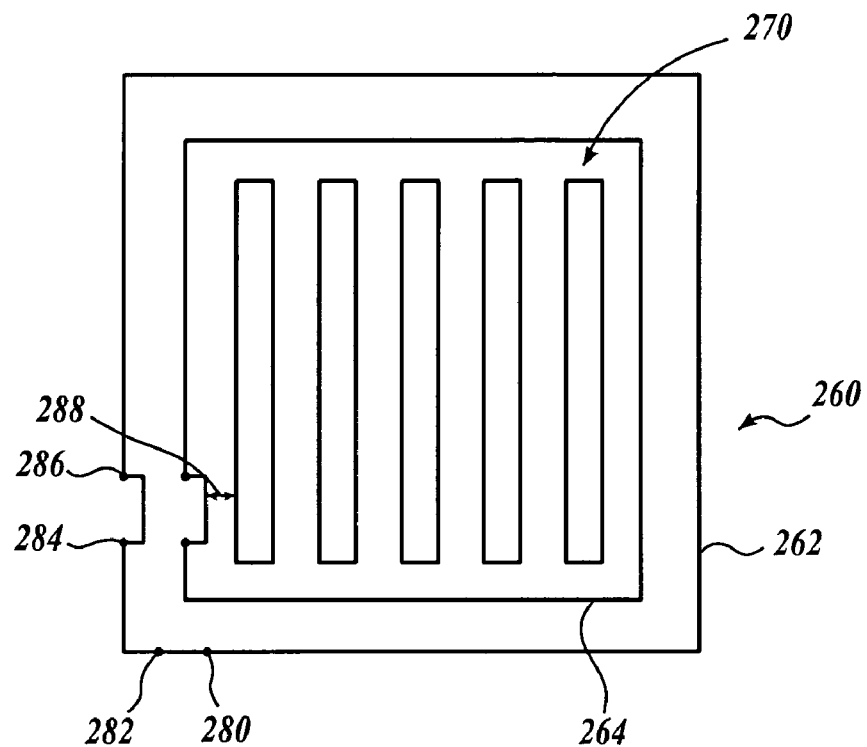
FIG. 4 illustrates a rim phase shifter and one or more internal phase shifting regions that can accommodate optical and process correction in accordance with an embodiment of the present invention.

FIG. 4 illustrates further detail of one method for creating larger features with filling phase shifting regions in accordance with the present invention. A larger feature is created with an annular rim shifter 260 having an outer edge 262 and an inner edge 264. In the embodiment shown, the edges of the rim phase shifter extend all the way around the perimeter of the rim phase shifter. However, as illustrated by the example shown in FIG. 3, this is not required. Within the area enclosed by the annular rim shifter 260, are a number of filling phase shifting regions 270. The filling phase shifting regions 270 may be sized and spaced such that they provide the desired distribution of illumination light on the wafer.

In some instances, it may be necessary to perform additional resolution enhancement techniques such as OPC on the objects to be created. Therefore, all or portions of the annular rim shifter 260 may be fragmented by including fragmentation endpoints 280, 282, 284, 286, etc., on either the outer edge, the inner edge or both the outer and inner edges of the rim shifter. Because the inner area of the feature is non-critical, the filling phase shifting regions in the interior of the rim shifter do not typically need to be corrected or otherwise verified. In one embodiment of the invention, these regions can be tagged or otherwise marked as not requiring OPC treatment. This OPC treatment may also consider the adjustment of edges assuming that the exposure will take place using some form of off-axis illumination, such as annular illumination, dipole illumination, QUASAR illumination or some other variation of quadrupole illumination, etc.

In one embodiment, the spacing 288 between the inner edge 264 of the annular rim phase shifter 260 and an adjacent edge of an internal filling phase shifting region 270 is set to accommodate any possible movement of the edge. Typically, the most critical edge of the annular rim phase shifter 260 is the outer edge. If the thickness of the annular rim portion of the phase shifter is great enough, the outer edge 262 can be adjusted without moving the inner edge 264 of the rim phase shifter. However, if these edges are sufficiently close together, it may be necessary to move both edges in parallel or by separate amounts. Therefore, the distance between the inner edge 264 of the rim phase shifter and an edge of the filling phase shifting regions 270 is selected to accommodate the possible movement.

As described above, each feature in an IC layout to be created on a wafer can be decomposed into data representing a pattern of phase shifters in accordance with the size of the feature. Which style of phase shifter to be used can be determined by calculating the size or area of the polygon that defines the target feature. Alternatively, other tests such as determining the distance between opposing edges of the polygon can be used to determine which type of phase shifting pattern should be used to create a corresponding object on a wafer.

Figure 5:
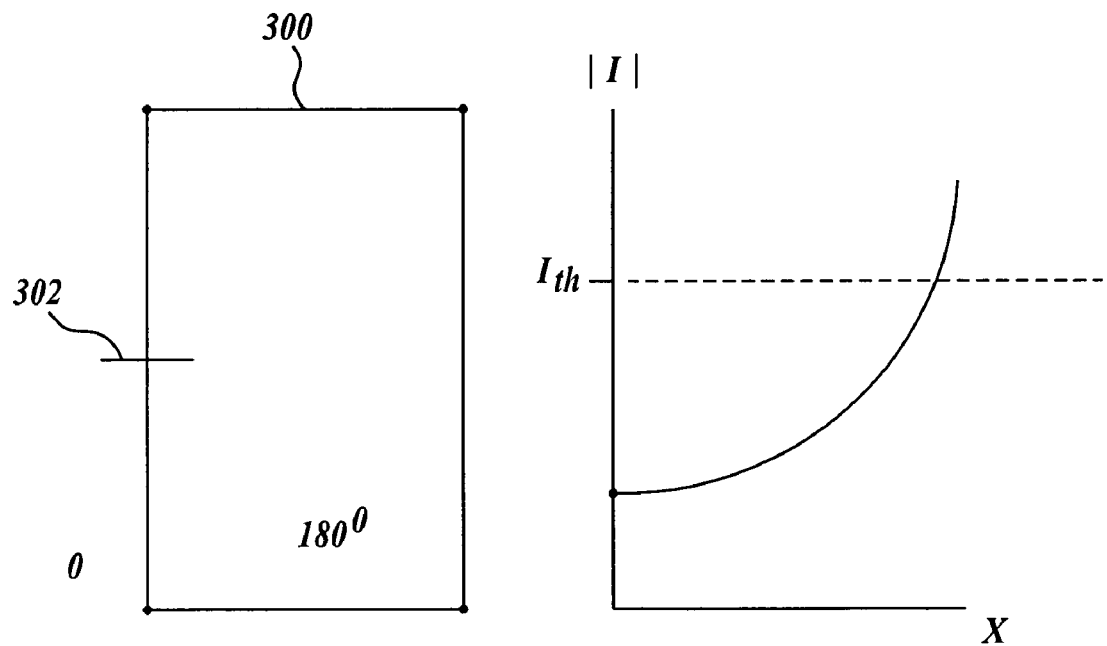
FIG. 5 illustrates a model-based approach to feature decomposition in accordance with an embodiment of the present invention.

In yet another alternative embodiment, a model-based approach can be used such as shown in FIG. 5 to determine what style of phase shifter should be used to create a feature on a wafer. In this embodiment, a target feature 300, originally designated to print as dark, is re-designated to be a transparent phase-shifting structure. Then, the feature 300 is fragmented and a simulation site 302 is placed on an edge of the fragmented feature. Simulations are performed at the site to determine the image intensity towards the interior of the phase shifter. If the image intensity begins to increase above a threshold such that the interior region may print on a wafer, the feature can be formed with an annular rim shifter and one or more internal filling phase shifting regions such as that described for the medium to large size features and shown in FIG. 3.

Figure 6:
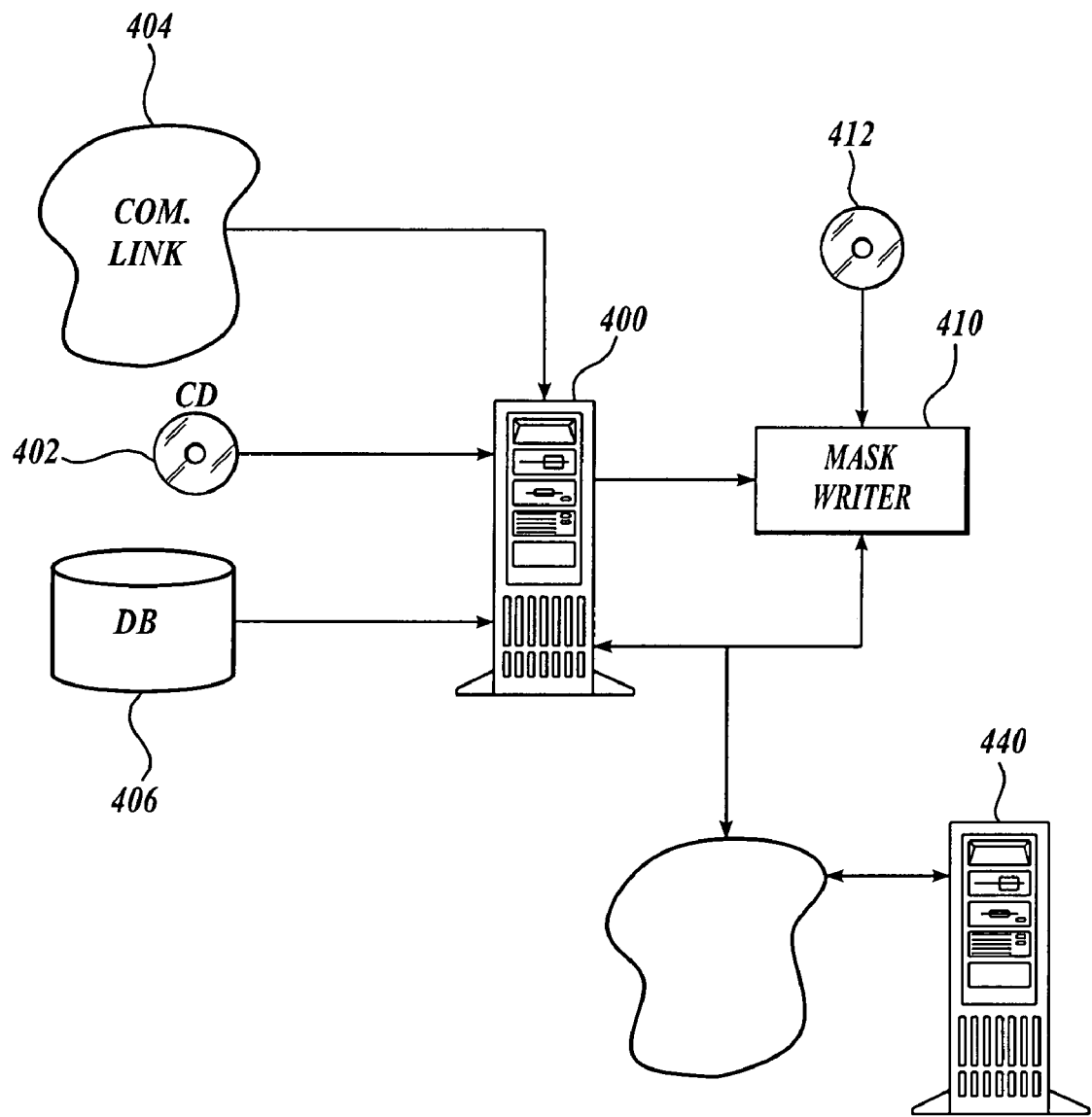
FIG. 6 illustrates one embodiment of a computer system that implements the present invention.

FIG. 6 illustrates one embodiment of a computer system used to implement the decomposition method of the present invention. A computer system 400 receives a series of executable instructions on a computer-readable media such as a CD-ROM, hard disk, DVD, etc., 402. Alternatively, the instructions can be embodied in an electromagnetic waveform received on a communication link 404 such as the Internet or computer communication network.

The computer system 400 executes the instructions to read all or a portion of a desired layout from a database 406. The layout is typically stored in a layout data format language such as GDS-II or OASIS™. The computer system 400 converts the desired layout of features into data representing a pattern of mask features as described above. The data representing the pattern of mask features is then transmitted to a mask writing tool 410 over a communication link or on a computer-readable media 412. In yet another embodiment of the invention, the computer system 400 may transmit the desired layout pattern to a remotely located computer 440 that may be inside or outside of the United States. The remote computer system 400 then performs the decomposition method as described above and returns data for a pattern of mask features that can be delivered to the mask writing tool 410 in order to create corresponding masks for use in photolithographic processing.

While the preferred embodiment of the invention has been illustrated and described, it will be appreciated that various changes can be made therein without departing from the scope of the invention. It is therefore intended that the scope of the invention be determined from the following claims and equivalents thereof.

The embodiments of the invention in which an exclusive property or privilege is claimed are defined as follows:

1. A method, comprising:
   receiving data representing one or more critical features and one or more non-critical features of all or a portion of a desired layout pattern to be created on a wafer;
   converting the data representing the one or more critical features into data defining phase shifting regions; and
   converting the data representing the one or more non-critical features into data defining one or more annular rim phase shifters, wherein one or more of the annular rim phase shifters comprise an annular rim phase shifting region having an outer edge and an inner edge, an interior region, and one or more filling phase shifting regions within the interior region.

2. The method of claim 1, further comprising generating data representing one or more opaque sub-resolution assist features.

3. The method of claim 1, further comprising generating data representing one or more partially transparent sub-resolution assist features.

4. The method of claim 1, further comprising:
   receiving data representing one or more non-critical features that are not adjacent to critical features in the desired layout pattern; and
   converting the data representing the one or more non-critical features that are not adjacent to critical features into data defining chrome areas.

5. The method of claim 1, wherein the converting of the data representing the one or more non-critical features comprises:
   determining whether an interior region of a selected one of the annular rim phase shifters will print as opaque on the wafer based on one or more dimensions of the annular rim phase shifting region associated with the selected one of the annular rim phase shifters; and
   defining the one or more filling phase shifting regions associated with the selected one of the annular rim phase shifters based on the determination.

6. The method of claim 1, further comprising determining whether the one or more of the annular rim phase shifters will print as opaque on the wafer based on simulation of image intensity corresponding to respective interior regions of the one or more of the annular rim phase shifters.

7. The method of claim 1, farther comprising:
   fragmenting respective outer edges of the one or more of the annular rim phase shifters into a number of edge fragments; and
   applying optical and process correction (OPC) to the edge fragments.

8. The method of claim 1, farther comprising tagging respective one or more filling phase shifting regions of the one or more of the annular rim phase shifters such that OPC is indicated as not required for the respective one or more filling phase shifting regions.

9. The method of claim 1, wherein the converting of the data representing the one or more non-critical features comprises:
   determining whether an image intensity corresponding to a portion of the interior region associated with a selected one of the annular rim phase shifters exceeds a printing threshold for the wafer; and
   defining the one or more filling phase shifting regions associated with the selected one of 10. One or more computer-readable media storing data produced by the method of claim 1.

11. The method of claim 1, further comprising generating a mask or reticle based on the data.

12. The method of claim 11, further comprising manufacturing an integrated circuit using the mask or the reticle.

13. A computer-readable media containing a sequence of instructions that when executed by a computer cause the computer to perform a method, the method comprising:
   receiving data representing one or more critical features and one or more non-critical features of all or a portion of a desired layout pattern to be created on a wafer;
   converting the data representing the one or more critical features into data defining phase shifting regions; and
   converting the data representing the one or more non-critical features into data defining one or more annular rim phase shifters, wherein one or more of the annular rim phase shifters comprise an annular rim phase shifting region having an outer edge and an inner edge, an interior region, and one or more filling phase shifting regions within the interior region.

14. The computer-readable media of claim 13, wherein the method further comprises generating data representing one or more sub-resolution assist features.

15. The computer-readable media of claim 13, wherein the method further comprises:
   fragmenting respective outer edges of the one or more of the annular rim phase shifters into a number of edge fragments; and
   applying OPC to the edge fragments.

16. The computer-readable media of claim 13, wherein the converting of the data representing the one or more non-critical features comprises:
   determining whether an image intensity corresponding to a portion of the interior region associated with a selected one of the annular rim phase shifters exceeds a printing threshold for the wafer; and
   defining the one or more filling phase shifting regions associated with the selected one of the annular rim phase shifters based on the determination.

17. A method, comprising:
   receiving data representing features of all or a portion of a desired layout pattern to be printed on a wafer;
   converting data representing smaller features into data defining phase shifting regions;
   converting data representing larger features into data defining annular rim phase shifting regions, each of the annular rim phase shifting regions having an interior region;
   determining whether the interior region of a selected annular rim phase shifting region will print as if opaque; and
   responsive to the determining, generating data defining one or more filling phase shifting regions for the interior region such that the interior region will print as if opaque on the wafer.

18. One or more computer-readable media storing data produced by the method of claim 17.

19. The method of claim 17, wherein the annular rim phase shifting regions have respective outer edges and inner edges, and the method further comprises:
   fragmenting the outer edges into a number of edge fragments; and
   applying OPC to the edge fragments of the outer edges.

20. The method of claim 19, further comprising:
   fragmenting the inner edges of the annular rim phase shifting regions into a number of edge fragments; and
   applying OPC to the edge fragments of the inner edges.

21. The method of claim 17, wherein determining whether the interior region of a selected annular rim phase shifting region will print as if opaque comprises determining whether an image intensity corresponding to a portion of the interior region exceeds a printing threshold for the wafer.

22. The method of claim 17, further comprising storing the data on a computer-readable media.

23. The method of claim 17, further comprising generating a mask or reticle based on the data.

24. The method of claim 23, further comprising manufacturing an integrated circuit using the mask or the reticle.

25. A computer-readable media containing a sequence of instructions that when executed by a computer cause the computer to perform a method, the method comprising:

receiving data representing features of all or a portion of a desired layout pattern to be printed on a wafer;

converting data representing smaller features into data defining phase shifting regions;

converting data representing larger features into data defining annular rim phase shifting regions, each of the annular rim phase shifting regions having an interior region;

determining whether the interior region of a selected annular rim phase shifting region will print as if opaque; and responsive to the determining, generating data defining one or more filling phase shifting regions for the interior region such that the interior region will print as if opaque on the wafer.

* * * * *

UNITED STATES PATENT AND TRADEMARK OFFICE
CERTIFICATE OF CORRECTION

| | | |
|---|---|---|
| PATENT NO. | : 7,493,587 B2 | Page 1 of 1 |
| APPLICATION NO. | : 11/144157 | |
| DATED | : February 17, 2009 | |
| INVENTOR(S) | : James Word | |

It is certified that error appears in the above-identified patent and that said Letters Patent is hereby corrected as shown below:

In the Claims:

Column 7, line 65, "selected one of" should read --selected one of the annular rim phase shifters based on the determination--.

Signed and Sealed this
First Day of February, 2011

David J. Kappos
*Director of the United States Patent and Trademark Office*